(12) United States Patent
Park et al.

(10) Patent No.: US 10,347,404 B2
(45) Date of Patent: *Jul. 9, 2019

(54) RESISTOR ELEMENT AND RESISTOR ELEMENT ASSEMBLY

(71) Applicant: SAMSUNG ELECTRO-MECHANICS CO., LTD., Suwon-Si, Gyeonggi-Do (KR)

(72) Inventors: Kwang Hyun Park, Suwon-si (KR); Jang Seok Yun, Suwon-si (KR); Kyung Seon Baek, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/652,927

(22) Filed: Jul. 18, 2017

(65) Prior Publication Data
US 2018/0122539 A1 May 3, 2018

(30) Foreign Application Priority Data
Oct. 31, 2016 (KR) .................. 10-2016-0143439

(51) Int. Cl.
| H01C 7/18 | (2006.01) |
| H01C 1/148 | (2006.01) |
| H01C 1/01 | (2006.01) |
| H05K 1/18 | (2006.01) |
| H01C 17/065 | (2006.01) |
| H01C 17/24 | (2006.01) |
| H05K 3/34 | (2006.01) |

(52) U.S. Cl.
CPC ............. *H01C 7/18* (2013.01); *H01C 1/01* (2013.01); *H01C 1/148* (2013.01); *H01C 17/06526* (2013.01); *H01C 17/24* (2013.01); *H05K 1/181* (2013.01); *H05K 3/3442* (2013.01); *H05K 2201/10022* (2013.01); *Y02P 70/611* (2015.11)

(58) Field of Classification Search
CPC . H01C 7/18; H01C 1/01; H01C 1/148; H01C 17/24; H01C 10/16
USPC ............................................. 338/332
See application file for complete search history.

(56) References Cited

U.S. PATENT DOCUMENTS 3,996,551 A * 12/1976 Croson .................. H01C 7/006
216/16
6,097,276 A * 8/2000 Van Den Broek ....... H01C 7/06
338/22 R (Continued)

FOREIGN PATENT DOCUMENTS

| JP | 2004-119692 A | 4/2004 |
| KR | 10-2013-0076599 | 7/2013 |
| KR | 10-1412951 B1 | 6/2014 |

*Primary Examiner* — Kyung S Lee
(74) *Attorney, Agent, or Firm* — Morgan Lewis & Bockius LLP

(57) ABSTRACT

A resistor element includes a base substrate having first and second surfaces opposing each other and first and second end surfaces opposing each other and connecting the first and second surfaces. A first resistor layer is on the first surface of the base substrate. First and second terminals are respectively on the first and second end surfaces. A second resistor layer is on the first resistor layer, is connected to the first and second terminals, and includes a copper-manganese-tin (Cu—Mn—Sn)-based composition.

19 Claims, 5 Drawing Sheets

(56) References Cited

U.S. PATENT DOCUMENTS

| | | | |
|---|---|---|---|
| 6,943,662 B2 * | 9/2005 | Tanimura | H01C 1/142 |
| | | | 257/537 |
| 9,691,838 B1 * | 6/2017 | Han | H01L 28/20 |
| 2004/0061096 A1 * | 4/2004 | Urano | H01B 1/22 |
| | | | 252/500 |
| 2010/0176913 A1 * | 7/2010 | Hirano | H01C 17/006 |
| | | | 338/328 |
| 2011/0089025 A1 * | 4/2011 | Yang | C23C 14/185 |
| | | | 204/192.21 |
| 2013/0154790 A1 * | 6/2013 | Park | H01C 17/06526 |
| | | | 338/309 |
| 2014/0049358 A1 | 2/2014 | Kim et al. | |

* cited by examiner

RESISTOR ELEMENT AND RESISTOR ELEMENT ASSEMBLY

CROSS-REFERENCE TO RELATED APPLICATION

This application claims the benefit of priority to Korean Patent Application No. 10-2016-0143439, filed on Oct. 31, 2016 in the Korean Intellectual Property Office, the entirety of which is incorporated herein by reference.

BACKGROUND

1. Field

The present disclosure relates to a resistor element and a resistor element assembly.

2. Description of Related Art

Chip-type resistor elements have been used to increase the wiring density of circuit boards, when electronic devices require miniaturization and light weight. Furthermore, as the required power of electronic devices increases, electronic devices have required resistor elements having a low level of resistance and a high degree of accuracy, while having overcurrent and battery level detecting circuits.

Metal formation methods can be used to manufacture resistor elements having a high degree of accuracy. However, such metal formation methods are limited in that the processes may be complicated and precise pattern design must be supported.

Thick film methods can be used as further methods of manufacturing resistor elements. The thick film method has relatively less complicated processes, but reduces the accuracy of the resistance, when used in resistor elements having a low level of resistance, due to the high specific resistance and temperature coefficient of resistivity of the resistive materials used to form the resistance layers and to thermoelectromotive forces occurring during trimming processes, which may lead to errors in the resulting resistance value.

SUMMARY

An aspect of the present disclosure may provide a resistor element that may control the generation of thermoelectromotive force during a trimming process.

The resistor element of the present disclosure may have an accurate, low resistance value by including a resistive material with a low temperature coefficient of resistivity and a low specific resistance value.

According to an aspect of the present disclosure, a resistor element may include a base substrate having first and second surfaces opposing each other and first and second end surfaces opposing each other and connecting the first and second end surfaces. A first resistor layer is on the first surface of the base substrate. First and second terminals are respectively on the first and second end surfaces. A second resistor layer is on the first resistor layer, is electrically connected to the first and second terminals, and includes a copper-manganese-tin (Cu—Mn—Sn)-based composition.

According to an aspect of the present disclosure, a resistor element assembly may include a circuit board having a plurality of electrode pads and a resistor element on the circuit board and electrically connected to the plurality of electrode pads. The resistor element may include a base substrate having first and second surfaces opposing each other and first and second end surfaces opposing each other and connecting the first and second end surfaces. A first resistor layer is on the first surface of the base substrate. First and second terminals are respectively on the first and second end surfaces. A second resistor layer is on the first resistor layer, is electrically connected to the first and second terminals, and includes a Cu—Mn—Sn-based composition.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
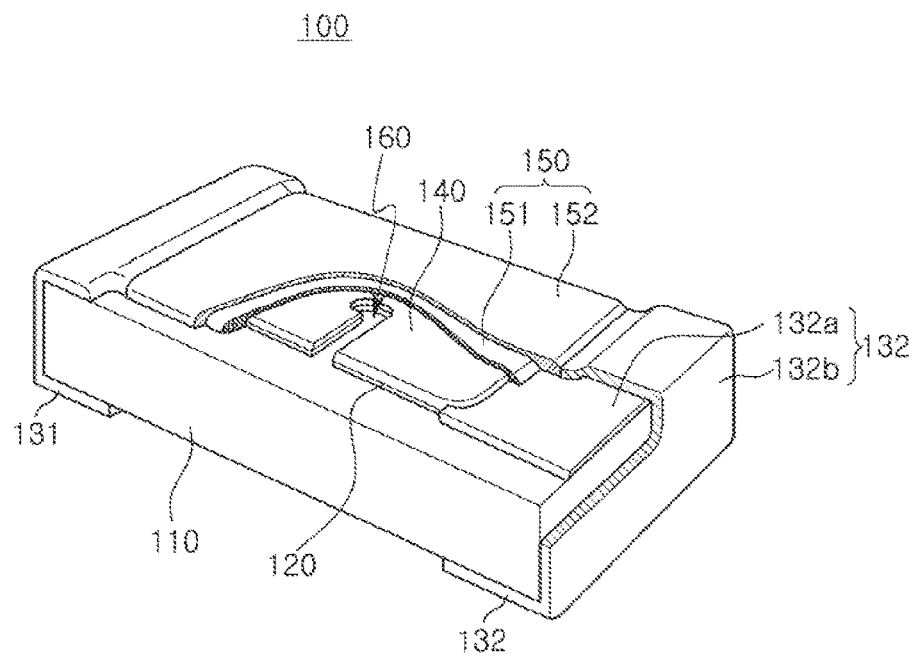
FIG. 1 is a partially cutaway perspective view illustrating an exemplary a resistor element.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s), as shown in the figures. It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and only a required configuration is proposed herein, but the present disclosure is not limited thereto.

Figure 2:
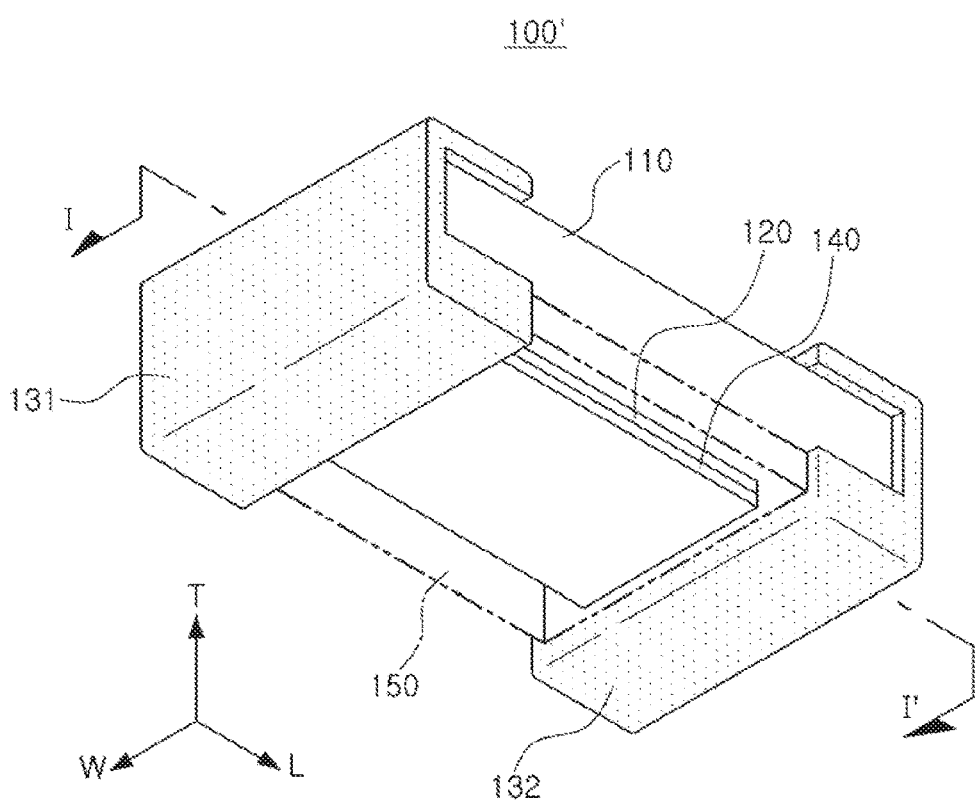
FIG. 2 is a perspective view illustrating another exemplary resistor element.

FIG. 1 is a partially cutaway perspective view of an exemplary resistor element 100. In the resistor element 100 illustrated in FIG. 1, the resistor layer is formed on a surface opposing the mounting-side surface of the resistor element. FIG. 2 is a perspective view illustrating another exemplary resistor element 100'. In the resistor element 100' illustrated in FIG. 2, the resistor layer is formed on the mounting-side surface of the resistor element. The resistor layer of the resistor element 100' of FIG. 2 may be closer to the wiring of the circuit board, to thus provide a more accurate resistance value.

Referring to FIGS. 1 and 2, the resistor element 100 or 100' may include a base substrate 110, a first resistor layer 120, a second resistor layer 140, a first terminal 131, and a second terminal 132.

The base substrate 110 may support the first resistor layer 120 and provide strength to the resistor element 100. The base substrate 110 may have a predetermined thickness and have a thin plate shape that includes first and second surfaces opposing each other, each having a rectangular shape. However, the shape of the base substrate 110 and the first and second surfaces are not limited thereto.

The base substrate 110 may be formed of a material with excellent thermal conductivity, and may externally dissipate heat generated in the first resistor layer 120 when the resistor element is in use.

The base substrate 110 may be formed of a ceramic material such as alumina ($Al_2O_3$) or a polymer material. In a particular example, the base substrate 110 may be an alumina substrate obtained by anodizing a surface of aluminum having a thin plate shape.

As illustrated in FIGS. 1-6, the first and second terminals 131 and 132 may be disposed on opposing end portions of the base substrate 110. The first terminal 131 may include a first internal electrode 131a and a first external electrode 131b. The second terminal 132 may include a second internal electrode 132a and a second external electrode 132b. The first and second terminals 131 and 132 will be described in more detail with reference to FIG. 3.

The first resistor layer 120 may be disposed on one surface of the base substrate 110. The second resistor layer 140 may be disposed on the first resistor layer 120. The first and second resistor layers 120 and 140 may be disposed between the first and second terminals 131 and 132, which are spaced apart from each other. The first and second resistor layers 120 and 140 may be electrically connected to the first and second terminals 131 and 132 to thus be used as resistor components. The first resistor layer 120 may be electrically connected to the first and second terminals 131 and 132 through the second resistor layer 140. The second resistor layer 140 may be disposed between the first resistor layer 120 and the first terminal 131 and between the first resistor layer 120 and the second terminal 132, in order to electrically connect the first resistor layer 120 to the first and second terminals 131 and 132 through the second resistor layer 140.

Various metals or alloys, or a compound such as an oxide, may be used as a material of the resistor layer 120. For example, the resistor layer 120 may include at least one of a Cu—Ni-based alloy, a Ni—Cr-based alloy, a Ru oxide, a Si oxide, Mn, and a Mn-based alloy. In addition, the first resistor layer 120 may further include glass and may be bonded to the base substrate 110 by a firing process after being printed in paste form.

The second resistor layer 140 may include a copper-manganese-tin (Cu—Mn—Sn)-based composition. The Cu—Mn—Sn-based composition having the trade name ZERANIN® may be readily oxidized due to characteristics thereof such that it is difficult to bond to a base substrate by a firing process of sintering under a high-temperature reduction atmosphere.

In the resistor element, the first resistor layer 120 may be bonded to the base substrate 110, and the second resistor layer 140 may be bonded to the first resistor layer 120. Thus, the first resistor layer 120 may bond the base substrate 110 and the second resistor layer 140 to each other.

The resistance values of the first and second resistor layers 120 and 140 may be set by a trimming process. The trimming process may refer to a process where the resistor layer is partially removed through fine cutting, or the like, after the resistor layer is formed in order to obtain the resistance value required for the design of the circuit.

In detail, the resistance value of the resistor element may be adjusted by forming a trimmed region 160 while measuring the resistance value of the resistor element during the trimming process, and stopping when the measured resistance value reaches the required resistance value.

Heat may be radiated when the trimmed region 160 is formed during the trimming process. The heat may generate thermoelectromotive force between the resistor layer and a terminal of the resistor element, and may cause distortion of a measured resistance value. In other words, the temperature difference between the resistor layer and the terminal may cause electromotive force between the resistor layer and the terminal, which may be expressed as thermoelectromotive force. The distortion of the resistance value caused by such thermoelectromotive force may be a factor that increases the failure rate when the resistor element is mass-produced.

As illustrated in FIG. 1, the first and second resistor layers 120 and 140 may include a trimmed region 160 removed by the trimming process. The region formed by the trimming process is not illustrated in FIG. 2, but a region having the same or similar shape may be formed in the first and second resistor layers 120 and 140.

The second resistor layer 140 may include the Cu—Mn—Sn-based composition. Thus, thermoelectromotive force may be suppressed during the trimming process and a more precise resistance value may be obtained by the trimming process. In particular, the Cu—Ni-based composition may have a thermoelectromotive force of −40 uV/k, while the Cu—Mn—Sn-based composition may have a thermoelectromotive force of −1 uV/k.

The Cu—Mn—Sn-based composition may have a relatively low temperature coefficient of resistivity (TCR). For example, the Cu—Mn—Sn-based composition may have an absolute value of the TCR of 100 ppm/° C. or less. Such a low TCR may have allow the resistor element to have robustness to temperature.

The resistor layer including the Cu—Mn—Sn-based composition may generate a low amount of thermoelectromotive force and have a low TCR to thus have a resistance value robust to a change in location where the region is to be formed in the trimming process.

The Cu—Mn—Sn-based composition may have a specific resistance value, for example, 29 μΩ/cm, less than that of the Cu—Ni-based composition, to thus be beneficial in the manufacturing of the resistor element having a fine resistance value.

A protective layer 150 may be disposed on a surface of the second resistor layer 140. The protective layer 150 may be disposed between the first and second terminals 131 and 132, may prevent the first and second resistor layers 120 and 140 from being externally exposed, and may protect the first and second resistor layers 120 and 140 from external impacts. The protective layer 150 may include silicon (SiO$_2$), glass, or a polymer, for example.

In a particular example, the protective layer 150 may include a first protective layer 151 formed of glass and a second protective layer 152 formed of a polymer. The first protective layer 151 may be formed before the trimming process to prevent the first and second resistor layers 120 and 140 from cracking during the trimming process, with the second protective layer 152 then formed after the trimming process to protect the first and second resistor layers 120 and 140.

Referring to FIG. 2, even though the protective layer 150 is disposed on the second resistor layer 140, the first and second terminals 131 and 132 may protrude beyond the protective layer 150, such that the first and second terminals 131 and 132 readily contact with electrode pads on a circuit board when mounting the resistor element 100'.

Hereinafter, various examples of the resistor element will be detailed with reference to a cross-sectional view thereof.

Figure 3:
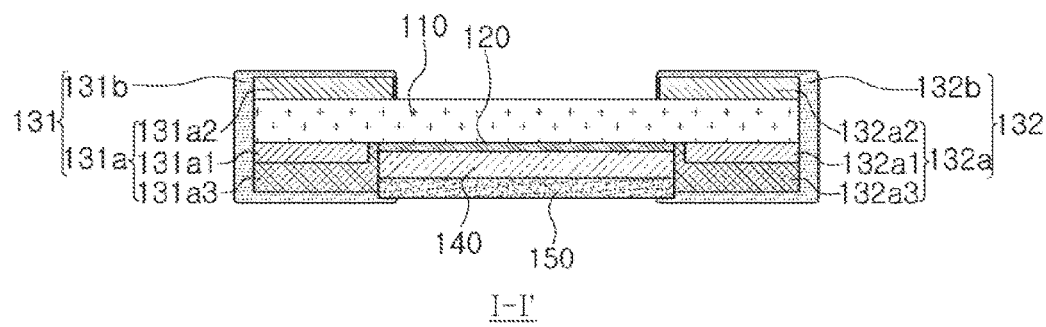
FIG. 3 is a cross-sectional view taken along line I-I' of FIG. 2.

FIG. 3 is a cross-sectional view taken along line I-I' of FIG. 2.

Referring to FIG. 3, the resistor element may include the base substrate 110, the first resistor layer 120, the second resistor layer 140, the first terminal 131, the second terminal 132, and the protective layer 150.

The base substrate 110 may have the first and second surfaces opposing each other, may have the first resistor layer 120 on the first surface thereof. The first and second resistor layers 120 and 140 are in contact with the first and second terminals 131 and 132.

The first resistor layer 120 may include a Cu-based composition or the Cu—Ni-based composition, and the second resistor layer 140 may include the Cu—Mn—Sn-based composition.

The first and second terminals 131 and 132 may surround opposing end portions of the base substrate 110, respectively, and may be connected to opposing end portions of the first and second resistor layers 120 and 140, respectively. The first and second resistor layers 120 and 140 may be bonded to each other.

The first and second terminals 131 and 132 may be electrically connected through a path having a parallel structure formed by the first and second resistor layers 120 and 140.

The parallel structure, formed by using heterogeneous materials, may distribute thermoelectromotive force, formed in the first resistor layer 120 during the trimming process, to the second resistor layer 140.

The second resistor layer 140 may have a low specific resistance value and a low TCR, and the resistor element may thus have resistance to temperature and have a more precise resistance value, as compared to resistor elements that only include one resistor layer.

An example of the first and second terminals 131 and 132 will hereinafter be detailed.

The first terminal 131 may include a first internal electrode 131a and a first external electrode 131b. The second terminal 132 may include the second internal electrode 132a and the second external electrode 132b.

The first and second internal electrodes 131a and 132a may be disposed on the opposing end portions of the base substrate 110.

The first and second external electrodes 131b and 132b may be disposed on the first and second internal electrodes 131a and 132a, respectively. In other words, the first external electrode 131b may cover at least a region of a surface of the first internal electrode 131a, and the second external electrode 132b may cover at least a region of a surface of the second internal electrode 132a.

The first internal electrode 131a may include a first seed electrode 131a1 and a first rear electrode 131a2. The second internal electrode 132a may include a second seed electrode 132a1 and a second rear electrode 132a2.

The first and second seed electrodes 131a1 and 132a1 may be disposed on the first surface of the base substrate 110, and the first and second rear electrodes 131a2 and 132a2 may be disposed on the second surface of the base substrate 110 opposing the first surface of the base substrate 110. The first seed electrode 131a1 may face the first rear electrode 131a2, and the second seed electrode 132a1 may face the second rear electrode 132a2.

Although not illustrated in FIG. 3, the first internal electrode 131a may further include a first side electrode, and the second internal electrode 132a may further include a second side electrode.

The first and second side electrodes may be disposed on opposing end surfaces of a laminate formed by stacking the base substrate 110, the first resistor layer 120, the second resistor layer 140, the first and second seed electrodes 131a1 and 132a1, and the first and second rear electrodes 131a2 and 132a2.

The first side electrode may be connected to the first seed electrode 131a1 and the first rear electrode 131a2, and the second side electrode may be connected to the second seed electrode 132a1 and the second rear electrode 132a2. When the first internal electrode 131a includes the first side electrode and the second internal electrode 132a includes the second side electrode, the first and second external electrodes 131b and 132b may also be formed on the first and second side electrodes, respectively.

The first internal electrode 131a may further include a first reinforcing layer 131a3, and the second internal electrode 132a may further include a second reinforcing layer 132a3.

The first reinforcing layer 131a3 may be disposed on the first seed electrode 131a1 to reinforce a thickness of the first terminal 131, and the second reinforcing layer 132a3 may be disposed on the second seed electrode 132a1 to reinforce a thickness of the second terminal 132.

Therefore, the thicknesses of the first and second terminals 131 and 132 may be secured, such that the first and second terminals 131 and 132 may more easily contact the electrode pads on the circuit board. Further, the surface areas of the first and second terminals 131 and 132 may be increased, such that bonding areas between the first and second terminals 131 and 132 and solder in the mounting process may be secured to increase adhesive strength.

The first and second internal electrodes 131a and 132a may be formed using a printing process (a process of printing and then firing a conductive paste) or a deposition process using a conductive paste. The first and second internal electrodes 131a and 132a may act as seeds in a plating process for the first and second external electrodes 131b and 132b. For example, the first and second internal electrodes 131a and 132a may include at least one of silver (Ag), copper (Cu), nickel (Ni), and platinum (Pt).

The first and second external electrodes 131b and 132b may be disposed on the first and second internal electrodes 131a and 132a by the plating process. The first and second external electrodes 131b and 132b may be formed after the protective layer 150 is formed.

The first and second external electrodes 131b and 132b may include at least one of nickel (Ni), tin (Sn), copper (Cu), and chromium (Cr). For example, the first and second external electrodes 131b and 132b may include a double layer of a Ni plating layer and a Sn plating layer, and may further include a Cu plating layer. The Ni plating layer may prevent a component of the internal electrode (for example, Ag) from leaching into a solder component when mounting the resistor element. The Sn plating layer may be provided to be easily bonded to the solder component when mounting the resistor element. The Cu plating layer may increase conductivity of the internal electrode.

Figure 4:
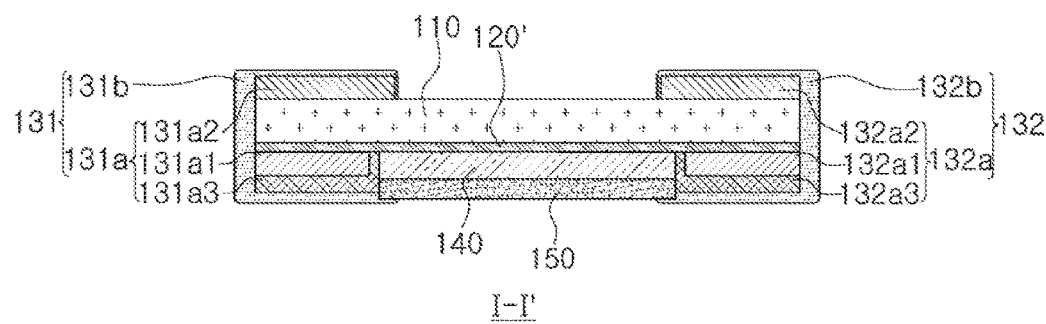
FIG. 4 is a cross-sectional view illustrating another exemplary resistor element.

FIG. 4 is a cross-sectional view illustrating another exemplary resistor element.

Compared to the resistor element illustrated in FIG. 3, a first resistor layer 120' of the resistor element illustrated in FIG. 4 may extend to opposing end portions of the base substrate 110. Therefore, first and second seed electrodes 131a1 and 132a1 may be disposed on the first resistor layer 120'. Beyond this difference, the resistor element may otherwise be configured in the same manner as the resistor element illustrated in FIG. 3, and overlapping descriptions will thus be omitted.

Figure 5:
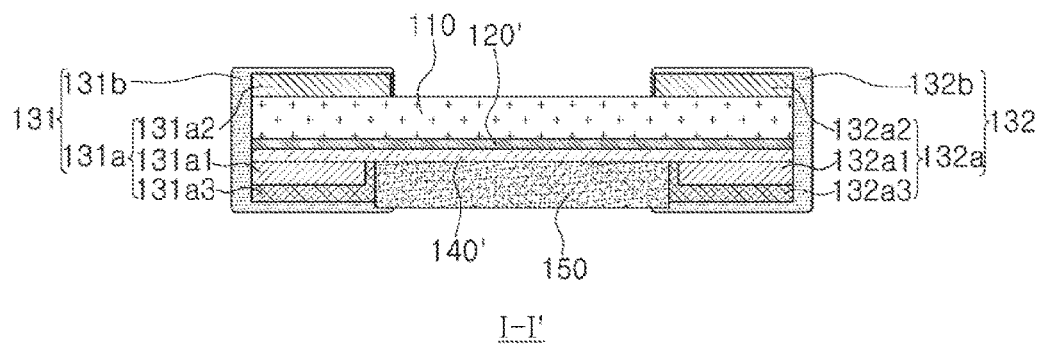
FIG. 5 is a cross-sectional view illustrating another exemplary resistor element.

FIG. 5 is a cross-sectional view illustrating another exemplary resistor element.

Compared to the resistor element illustrated in FIG. 4, a second resistor layer 140' of the resistor element illustrated in FIG. 5 may extend to opposing end portions of the base substrate 110, similar to the first resistor layer 120'. Therefore, first and second seed electrodes 131a1 and 132a1 may be disposed on the second resistor layer 140'. In other words, the second resistor layer 140' may be disposed between the first resistor layer 120' and the first seed electrode 131a1 of a first terminal 131 and between the first resistor layer 120' and the second seed electrode 132a1 of a second terminal 132.

Accordingly, the areas where the second resistor layer 140' is in contact with the first and second terminals 131 and 132 may be much larger than areas where the first resistor layer 120' is in contact with the first and second terminals 131 and 132.

Beyond these differences, the resistor element may otherwise be configured in the same manner as the resistor element illustrated in FIG. 3, and overlapping descriptions will thus be omitted.

Figure 6:
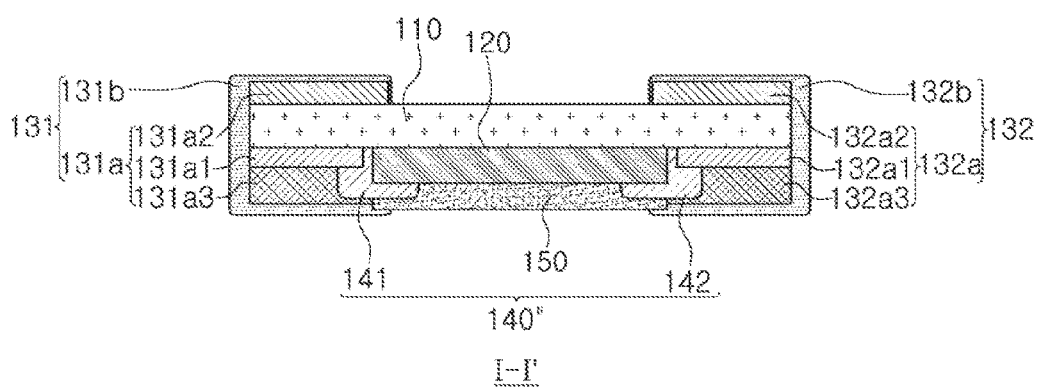
FIG. 6 is a cross-sectional view illustrating another exemplary resistor element.

FIG. 6 is a cross-sectional view illustrating another exemplary resistor element.

Compared to the resistor element illustrated in FIG. 3, a second resistor layer 140" of the resistor element illustrated in FIG. 6 may include a first resistor 141 and a second resistor 142.

Referring to FIG. 6, the first and second resistors 141 and 142 may be separated from each other across the first resistor layer 120. The first resistor 141 may be between the first resistor layer 120 and the first terminal 131, and the second resistor 142 may be between the first resistor layer 120 and the second terminal 132. The first terminal 131 may have a gap relative to the first resistor layer 120, and the second terminal 132 may have a gap relative to the first resistor layer 120, in order to dispose the first resistor 141 between the first resistor layer 120 and the first terminal 131, and dispose the second resistor 142 between the first resistor layer 120 and the second terminal 132. The gaps may be filled with the first and second resistors 141 and 142, respectively, to collectively form the second resistor layer 140".

In other words, the first resistor 141 may form a bridge structure connecting the first terminal 131 to the first resistor layer 120, and the second resistor 142 may form a bridge structure connecting the second terminal 132 to the first resistor layer 120.

When the first resistor layer 120 includes a copper-nickel (Cu—Ni)-based composition and the first terminal 131 includes copper (Cu), the first resistor 141 may include a copper-manganese-tin (Cu—Mn—Sn)-based composition, and thus thermoelectromotive force that may be generated between the first resistor layer 120 and the first terminal 131 may be blocked.

Beyond these differences, the resistor element may otherwise be configured in the same manner as the resistor element illustrated in FIG. 3, and overlapping descriptions will thus be omitted.

Figure 7:
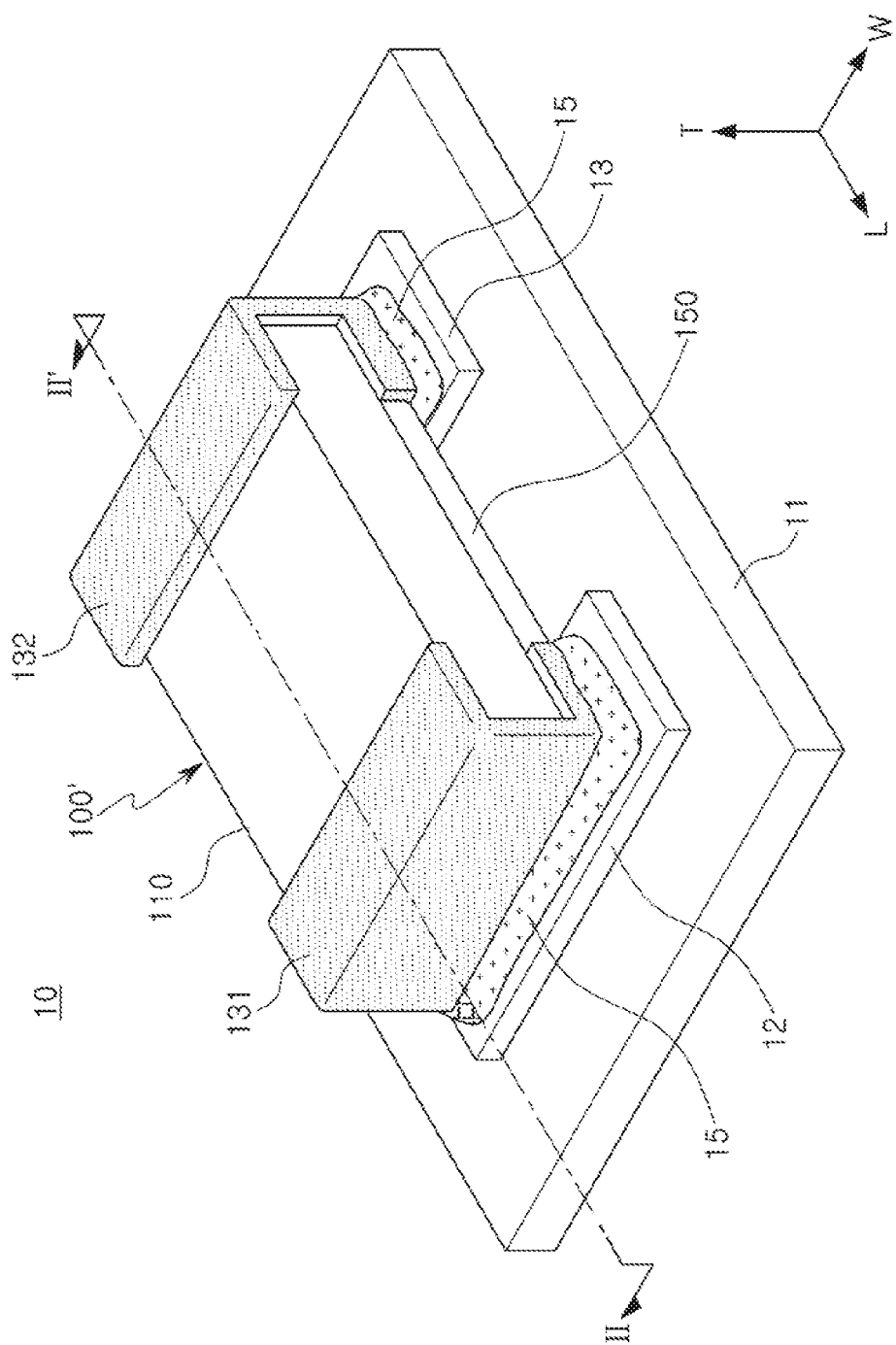
FIG. 7 is a perspective view illustrating an exemplary resistor element assembly.
Figure 8:
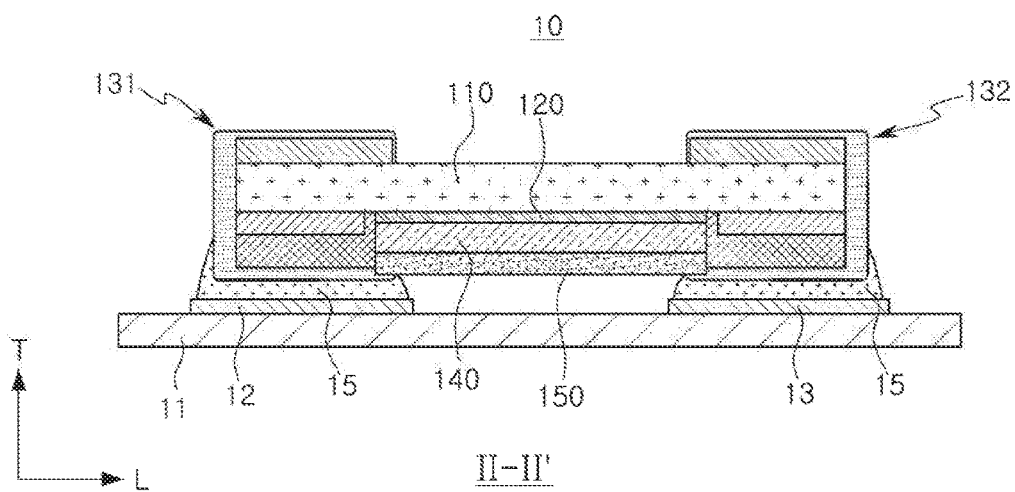
FIG. 8 is a cross-sectional view taken along line II-II' of FIG. 7.

FIG. 7 is a perspective view illustrating an exemplary resistor element assembly. FIG. 8 is a cross-sectional view taken along line II-II' of FIG. 7.

Referring to FIGS. 7 and 8, a resistor element assembly 10 may include a circuit board 11 on which the resistor element 100' illustrated in FIG. 2 is mounted. The resistor element assembly 10 may have the resistor element 100 illustrated in FIG. 1 employed therein, but is not limited thereto.

The circuit board 11 may include first and second electrode pads 12 and 13 disposed in a mounting region of the resistor element. The first and second electrode pads 12 and 13 may refer to land patterns connected to a circuit pattern implemented on the circuit board 11 and provided to mount the resistor element.

The resistor element may include the base substrate 110, the first resistor layer 120 disposed on the first surface of the base substrate 110, the first and second terminals 131 and 132 disposed on the opposing end portions of the base substrate 110, and the second resistor layer 140 disposed on the first resistor layer 120. The second resistor layer 140 may be connected to the first and second terminals 131 and 132, and may include a copper-manganese-tin (Cu—Mn—Sn)- based composition. In addition, the resistor element may further include the protective layer 150.

As previously discussed, the second resistor layer 140 may have the low resistance value and the low TCR, and thus the resistor element may have resistance to temperature and have a more precise resistance value, as compared to resistor elements that only include one resistor layer.

The resistor element 100' may be understood from the resistor elements described with reference to FIGS. 2 through 6, and overlapping descriptions will thus be omitted.

The circuit board 11 may have an electronic circuit formed thereon, and an integrated circuit (IC) for a specific operation or control of an electronic apparatus, or the like, may be formed on the circuit board 11, such that a current supplied by a separate power supply may flow to the circuit board 11.

The circuit board 11 may include various wiring lines or further include other types of semiconductor elements such as a transistor, and the like. The circuit board 11 may be variously configured, if required. For example, the circuit board 11 may include a conductive layer or a dielectric layer.

The first and second electrode pads 12 and 13 may be spaced apart from each other on the circuit board 11, and may be respectively connected to the first and second terminals 131 and 132 of the resistor element 100' by solder 15.

FIGS. 7 and 8 illustrate the first electrode pad 12 connected to the first terminal 131, and the second connection pad 13 connected to the second terminal 132. However, the first electrode pad 12 may be connected to the second terminal 132 and the second connection pad 13 may be connected to the first terminal 131, depending on the design.

As set forth above, a resistor element and a resistor element assembly reduce production costs and failure rates by simplifying production methods and controlling the generation of thermoelectromotive force during a trimming process.

Further, the resistor element and the resistor element assembly may implement a low resistance value, while being less affected by temperatures, by including a resistive material having a low temperature coefficient of resistivity and a low specific resistance value.

While exemplary embodiments have been shown and described above, it will be apparent to those skilled in the art that modifications and variations could be made without departing from the scope of the present invention, as defined by the appended claims.

What is claimed is:

1. A resistor element comprising:
a base substrate having first and second surfaces opposing each other and first and second end surfaces opposing each other and connecting the first and second surfaces;
a first resistor layer on the first surface of the base substrate;
first and second terminals respectively on the first and second end surfaces; and
a second resistor layer on the first resistor layer, connected to the first and second terminals,
wherein the first resistor layer comprises a first composition with a first thermoelectromotive force, the second resistor layer comprises a second composition with a second thermoelectromotive force, and an absolute value of the second thermoelectromotive force is smaller than an absolute value of the first thermoelectromotive force.

2. The resistor element of claim 1, wherein the first resistor layer comprises a copper-nickel (Cu—Ni)-based composition and the second resistor layer comprises a copper-manganese-tin (Cu—Mn—Sn)-based composition.

3. The resistor element of claim 1, wherein the first and second terminals are connected to respective opposing end portions of both the first and second resistor layers, and the first and second resistor layers are bonded to each other.

4. The resistor element of claim 1, wherein the second resistor layer is between the first resistor layer and the first terminal and between the first resistor layer and the second terminal.

5. The resistor element of claim 4, wherein the second resistor layer comprises first and second resistors separated across the first resistor layer, with the first resistor between the first resistor layer and the first terminal and the second resistor between the first resistor layer and the second terminal.

6. The resistor element of claim 1, wherein the first and second resistor layers each include a region removed by a trimming process.

7. The resistor element of claim 1, further comprising:
a first protective layer on the first and second resistor layers and including glass; and
a second protective layer on the first protective layer and including a polymer.

8. The resistor element of claim 1, wherein the first and second terminals respectively include first and second internal electrodes on the base substrate, and respectively include first and second external electrodes respectively on the first and second internal electrodes.

9. The resistor element of claim 1, wherein a material of the second resistor layer has an absolute value of a temperature coefficient of resistivity (TCR) of 100 ppm/° C. or less.

10. The resistor element of claim 1, wherein the first resistor layer further comprises glass, and is bonded to the base substrate by a firing process after being printed in a paste form.

11. A resistor element assembly comprising:
a circuit board having a plurality of electrode pads; and
a resistor element on the circuit board and electrically connected to the plurality of electrode pads,
the resistor element comprising:
a base substrate having first and second surfaces opposing each other and first and second end surfaces opposing each other and connecting the first and second surfaces;
a first resistor layer on the first surface of the base substrate;
first and second terminals respectively on the first and second end surfaces; and
a second resistor layer on the first resistor layer, connected to the first and second terminals,
wherein the first resistor layer comprises a first composition with a first thermoelectromotive force, the second resistor layer comprises a second composition with a second thermoelectromotive force, and an absolute value of the second thermoelectromotive force is smaller than an absolute value of the first thermoelectromotive force.

12. The resistor element assembly of claim 11, wherein the first resistor layer comprises a Cu—Ni-based composition and the second resistor layer comprises a copper-manganese-tin (Cu—Mn—Sn)-based composition.

13. The resistor element assembly of claim 11, wherein the first and second terminals are connected to respective opposing end portions of both the first and second resistor layers, and the first and second resistor layers are bonded to each other.

14. The resistor element assembly of claim 11, wherein the second resistor layer is between the first resistor layer and the first terminal and between the first resistor layer and the second terminal.

15. The resistor element assembly of claim 14, wherein the second resistor layer comprises first and second resistors separated across the first resistor layer, with the first resistor between the first resistor layer and the first terminal and the second resistor between the first resistor layer and the second terminal.

16. A resistor element comprising:
- a base substrate having first and second surfaces opposing each other and first and second end surfaces opposing each other and connecting the first and second surfaces;
- a first resistor layer on the first surface of the base substrate and spaced apart from the first and second end surfaces;
- first and second terminals respectively on the first and second end surfaces of the base substrate, and each extending on a portion of the first surface of the base substrate; and
- a second resistor layer on the first resistor layer and connected to the first and second terminals,
- wherein the first resistor layer comprises a first composition with a first thermoelectromotive force, the second resistor layer comprises a second composition with a second thermoelectromotive force, and an absolute value of the second thermoelectromotive force is smaller than an absolute value of the first thermoelectromotive force.

17. The resistor element of claim 16, wherein:
the first composition is a copper-nickel (Cu—Ni)-based composition, and
the second composition is a copper-manganese-tin (Cu—Mn—Sn)-based composition.

18. The resistor element of claim 16, further comprising:
a first protective layer on the second resistor layer; and
a second protective layer on the first protective layer,
wherein the first resistor layer, the second resistor layer, and the first protective layer each include a region removed by a trimming process.

19. The resistor element of claim 16, wherein the second resistor layer comprises:
- a first resistor between the first resistor layer and the portion of the first terminal extending on the first surface of the base substrate; and
- a second resistor between the first resistor layer and the portion of the second terminal extending on the first surface of the base substrate.

* * * * *